United States Patent
Meyer et al.

(10) Patent No.: US 7,064,279 B2
(45) Date of Patent: Jun. 20, 2006

(54) CIRCUIT BOARD HAVING AN OVERLAPPING VIA

(75) Inventors: Matthew C. Meyer, Mesa, AZ (US); Jesse C. Chai, Chandler, AZ (US); Paul H. Roosen, Mesa, AZ (US); Robert T. Young, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 63 days.

(21) Appl. No.: 10/948,598

(22) Filed: Sep. 23, 2004

(65) Prior Publication Data

US 2006/0060380 A1 Mar. 23, 2006

(51) Int. Cl.
*H05K 1/16* (2006.01)

(52) U.S. Cl. .................. 174/260; 174/262; 174/266

(58) Field of Classification Search .......... 174/266, 174/260, 262, 263, 264, 265
See application file for complete search history.

(56) References Cited

U.S. PATENT DOCUMENTS

| 5,637,835 | A | * | 6/1997 | Matern | 174/266 |
|---|---|---|---|---|---|
| 5,784,262 | A | * | 7/1998 | Sherman | 361/777 |
| 5,875,102 | A | * | 2/1999 | Barrow | 361/777 |
| 6,078,013 | A | * | 6/2000 | Stack | 174/262 |
| 6,091,155 | A | * | 7/2000 | Jonaidi | 257/786 |
| 6,168,854 | B1 | * | 1/2001 | Gibbs | 428/209 |
| 6,346,679 | B1 | * | 2/2002 | Nakamura | 174/260 |
| 6,509,530 | B1 | * | 1/2003 | Pearson et al. | 174/260 |
| 6,700,457 | B1 | | 3/2004 | McCall et al. | |
| 6,710,433 | B1 | * | 3/2004 | Megahed et al. | 257/678 |
| 6,828,513 | B1 | * | 12/2004 | Kistner | 174/261 |
| 2003/0047348 | A1 | | 3/2003 | Jessep et al. | |

\* cited by examiner

*Primary Examiner*—Hung V. Ngo
(74) *Attorney, Agent, or Firm*—Kevin D. Wills

(57) ABSTRACT

A printed circuit board (100) includes a first BGA landing pad (102) having a first clearance zone (106) and a second BGA landing pad (104) having a second clearance zone (108). A via (110), overlaps the first clearance zone and the second clearance zone such that the first BGA landing pad and the second BGA landing pad are electrically coupled to the via.

6 Claims, 1 Drawing Sheet

CIRCUIT BOARD HAVING AN OVERLAPPING VIA

BACKGROUND OF THE INVENTION

As ball pitch on integrated circuit packages decrease, it becomes more difficult to fan out signal paths to their appropriate layers. If the pitch becomes small enough, vias cannot fit within the ball grid array (BGA) without violating clearance rules. In the prior art, trace paths are routed outside of the BGA grid before vias are used. This creates parasitic effects on the power and ground connections that can reduce electrical performance of the integrated circuit.

Accordingly, there is a significant need for an apparatus and method that overcomes the deficiencies of the prior art outlined above.

BRIEF DESCRIPTION OF THE DRAWINGS

Referring to the drawing.

Figure 1:
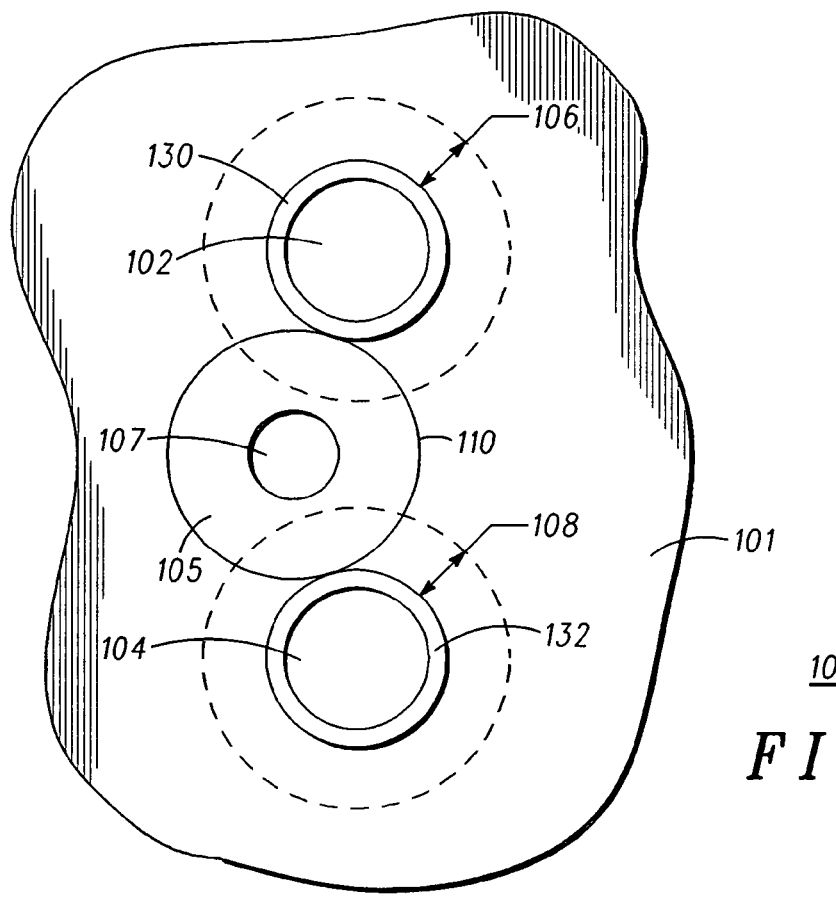
FIG. 1 depicts a printed circuit board in accordance with an embodiment of the invention.

It will be appreciated that for simplicity and clarity of illustration, elements shown in the drawing have not necessarily been drawn to scale. For example, the dimensions of some of the elements are exaggerated relative to each other. Further, where considered appropriate, reference numerals have been repeated among the Figures to indicate corresponding elements.

DESCRIPTION OF THE PREFERRED EMBODIMENTS

In the following detailed description of exemplary embodiments of the invention, reference is made to the accompanying drawings, which illustrate specific exemplary embodiments in which the invention may be practiced. These embodiments are described in sufficient detail to enable those skilled in the art to practice the invention, but other embodiments may be utilized and logical, mechanical, electrical and other changes may be made without departing from the scope of the present invention. The following detailed description is, therefore, not to be taken in a limiting sense, and the scope of the present invention is defined only by the appended claims.

In the following description, numerous specific details are set forth to provide a thorough understanding of the invention. However, it is understood that the invention may be practiced without these specific details. In other instances, well-known circuits, structures and techniques have not been shown in detail in order not to obscure the invention.

For clarity of explanation, the embodiments of the present invention are presented, in part, as comprising individual functional blocks. The functions represented by these blocks may be provided through the use of either shared or dedicated hardware, including, but not limited to, hardware capable of executing software. The present invention is not limited to implementation by any particular set of elements, and the description herein is merely representational of one embodiment.

FIG. 1 depicts a printed circuit board 100 in accordance with an embodiment of the invention. As shown in FIG. 1, printed circuit board 100 can include surface 101 having first ball grid array (BGA) landing pad 102 and second BGA landing pad 104. Printed circuit board 100 can be any generic substrate for placing integrated circuit package chips as is known in the art. For example and without limitation, printed circuit board 100 can comprise a substrate having any number of layers of dielectric material, such as Fiberglass FR408 interposed with conductive layers coupled to any number of integrated circuits on surface 101.

As is known in the art, a ball grid array is a type of surface-mount packaging used for integrated circuits. It is descended from the pin grid array (PGA), which is an integrated circuit package with one face covered (or partly covered) with pins in a grid pattern. These pins are used to conduct electrical signals from the integrated circuit to the printed circuit board (PCB) it is placed on. In a BGA, the pins are replaced by balls of solder stuck to the bottom of the integrated circuit package. The device is placed on a PCB that carries BGA landing pads, which can be, for example, copper pads in a pattern that matches the solder balls. The assembly is then heated, either in a reflow oven or by an infrared heater, causing the solder balls to melt. Surface tension causes the molten solder to hold the package in alignment with the circuit board, at the correct separation distance, while the solder cools and solidifies. The composition of the solder alloy and the soldering temperature can be chosen by one skilled in the art so that the solder does not completely melt, but stays semi-liquid, allowing each ball to stay separate from its neighbors.

In an embodiment, first BGA landing pad 102 and second BGA landing pad 104 can comprise any conductive material, such as copper, and the like. As is known in the art, first BGA landing pad 102 and second BGA landing pad 104 can be placed on surface 101 by conventional masking and etching techniques known in the art, such as conventional photoresist, and the like. Although first BGA landing pad 102 and second BGA landing pad 104 are shown as substantially round, this is not limiting of the invention. First BGA landing pad 102 and second BGA landing pad 104 can have any shape and be within the scope of the invention. For example, first BGA landing pad 102 and second BGA landing pad 104 can be rectangular, oval, and the like, and be within the scope of the invention.

In an embodiment, first BGA landing pad 102 can include barrier 130 and second BGA landing pad 104 can include barrier 132. Barrier 130, 132 can be solder mask, or any other material to prevent the spread of solder off of BGA landing pad. In an embodiment, barrier 130, 132 can be raised above the surface of its respective BGA landing pad as will be shown more clearly in FIG. 2. In an embodiment, barrier 130, 132 or a portion thereof, can be located on top of its respective BGA landing pad. In another embodiment, barrier 130, 132 can be located adjacent to its respective BGA landing pad. In yet another embodiment, barrier 130, 132 can be located partly over BGA landing pad and partly on surface.

In an embodiment, first BGA landing pad 102 can be circumscribed by first clearance zone 106, which can also be known in the art as a "keep out zone," and the like. The purpose of clearance zone 106 is to not permit other elements on surface 101 of PCB 100 to be placed in an area around first BGA landing pad 102. This is to ensure the absence of stray solder coupled to first BGA landing pad 102 from electrically contacting other elements on surface 101. Since a ball of solder is heated in the process of coupling to first BGA landing pad 102, solder can flow past the boundaries of first BGA landing pad 102. In order to avoid unwanted electrical contacts, first clearance zone 106 is established around first BGA landing pad 102 to ensure the absence of other PCB items that might interfere or be interfered with by solder balls coupled to first BGA landing pad, and the like. In an embodiment, second BGA landing pad 104 can be circumscribed by second clearance zone 108 to serve a purpose analogous to that described above with reference to first clearance zone 106.

The size of first BGA landing pad 102 and second BGA landing pad 104 is dependent on the size of connection to be made, the type and material of the solder ball, the process of mounting the integrated circuit to the first and second BGA landing pads, and the like. For example, the size and shape of first BGA landing pad 102 can be the same or different from the size and shape of the second BGA landing pad 104 and be within the scope of the invention. Analogously, the size of first and second clearance zone can be specified by one skilled in the art depending on the application, size of BGA landing pad, type and material of solder ball, process of mounting the integrated circuit, and the like. For example, the size and shape of first clearance zone 106 can be the same or different from the size and shape of second clearance zone 108 and be within the scope of the invention.

In an embodiment, printed circuit board 100 can also include via 110. As is known in the art, via 110 can be an electrical contact between two conductive layers in a semiconductor device. For example, via 110 can comprise a conductively-lined opening 107 from surface 101 to a conductive layer within or on another surface of printed circuit board 100. Conductively-lined opening 107 can be defined by printed circuit board 100 and surface 101. In an embodiment, via 110 can electrically couple a BGA landing pad to another conductive layer or trace on printed circuit board. Conductively lined opening 107 can have a cylindrical shape. This is not limiting of the invention as conductively lined opening 107 can have any shape and be within the scope of the invention.

As shown in FIG. 1, via 110 can include via pad 105 around conductively-lined opening 107. Via pad 105 can be a conductive layer surrounding at least a portion of conductively lined opening 107. In the prior art, via 110, including via pad 105, were forbidden from being placed such that the via would violate a clearance zone (keep out zone) around a BGA landing pad for reasons discussed above.

In an embodiment, via 110 can overlap first clearance zone 106 and second clearance zone 108 such that first BGA landing pad 102 and second BGA landing pad 104 are electrically coupled to via 110. In an embodiment, via pad 105 of via 110 can be in electrical contact with first BGA landing pad 102 and second BGA landing pad 104. In the embodiment depicted in FIG. 1, via pad 105 of via 110 can overlap both first clearance zone 106 and second clearance zone 108 but not overlap first BGA landing pad 102 or second BGA landing pad 104. In another embodiment, via 110 can overlap with at least one of first BGA landing pad 102 and second BGA landing pad 104. In this embodiment, via 110 is also in electrical contact with first BGA landing pad 102 and second BGA landing pad 104. Overlapping via 110 with first clearance zone 106 and second clearance zone 108 has the advantage efficiently utilizing limited PCB space when fine-pitched BGA arrays are used.

In an embodiment, via 110 is overlapping first clearance zone 106 and second clearance zone 108, and electrically coupling first BGA landing pad 102 and second BGA landing pad 104. In this embodiment, first BGA landing pad 102 and second BGA landing pad 104 are coupled to be at the same voltage level. For example, the embodiment depicted in FIG. 1 can be utilized in fine-pitch ball grid arrays where first BGA landing pad 102 and second BGA landing pad 104 are both coupled to be at the same voltage level. For example, first BGA landing pad 102 and second BGA landing pad 104 can both be coupled to supply power, at the same voltage level, to an integrated circuit package coupled to be mounted to both pads. In another embodiment, the same voltage level can be a ground level. For example, both first BGA landing pad 102 and second BGA landing pad 104 can both be coupled to supply a ground to an integrated circuit package coupled to be mounted to both pads.

The relative position of first BGA landing pad 102, second BGA landing pad 104 and via 110 shown in FIG. 1 is not limiting of the invention. In an embodiment, each of first BGA landing pad 102, second BGA landing pad 104 and via 110 can be aligned in a rectilinear pattern relative to each other. In another embodiment, each of first BGA landing pad 102, second BGA landing pad 104 and via 110 can be skewed relative to each other in any direction and be within the scope of the invention. Also, the invention is not limited to via 110 electrically coupling only two BGA landing pads. Via 110 can electrically couple any number of BGA landing pads and be within the scope of the invention. Also, first BGA landing pad 102 and second BGA landing pad 104 do not each have to be the same distance from via 110. Each of first BGA landing pad 102 and second BGA landing pad 104 can be a unique distance from via 110 and be within the scope of the invention.

Figure 2:
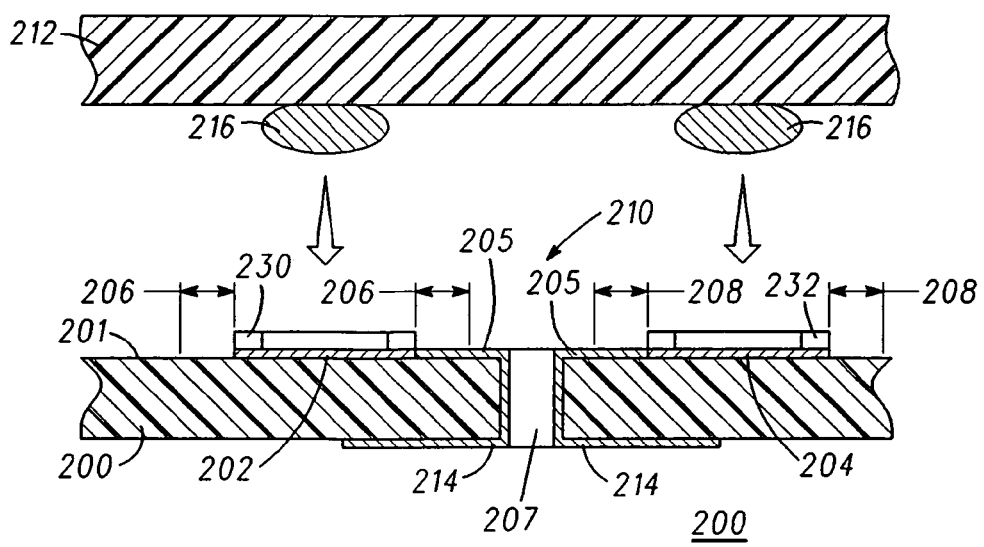
FIG. 2 depicts a section view of a printed circuit board and a packaged chip according to an embodiment of the invention.

FIG. 2 depicts a section view of a printed circuit board 200 and a packaged chip 212 according to an embodiment of the invention. As shown in FIG. 2, printed circuit board 200 can include surface 201 having a first BGA landing pad 202 and second BGA landing pad 204. First BGA landing pad 202 can have first clearance zone 206. Second BGA landing pad 204 can have second clearance zone 208. Also, first BGA landing pad 202 can have barrier 230, and second BGA landing pad 204 can have barrier 232.

Printed circuit board 200 can include via 210. In an embodiment, via 210 can overlap first clearance zone 206 and second clearance zone 208 as described above. Via 210 can include via pad 205 as described above. As shown in FIG. 2, via pad 205 of via 210 can be electrically coupled to first BGA landing pad 202 and second BGA landing pad 204. Via pad 205 of via 210 can overlap first clearance zone 206 and second clearance zone 208. Via 210 can include conductively-lined opening 207 from surface 201 to circuit board trace 214. Conductively-lined opening 207 can any shape, for example and without limitation, cylindrical, and the like. Via 210 can be electrically coupled to circuit board trace 214, where circuit board trace can be a conductive layer either within printed circuit board 200 or on an another surface of printed circuit board 200. Circuit board trace 214 can be used to provide a conductive path from via 210 to other elements on or within printed circuit board 200. In an embodiment, via 210 can electrically couple first BGA landing pad 202 and second BGA landing pad 204 to circuit board trace 214.

Via 210 is not limited by the geometry depicted in FIG. 2. For example, via 210 can include sloping sides from each of first clearance zone 206 and second clearance zone 208 to conductively-lined opening 207. This embodiment, allows conductively lined opening 207 to be masked from surface 201 of printed circuit board 200 while still maintaining electrical coupling of first BGA landing pad 202 and second BGA landing pad 204. Any two or three dimensional geometry of via 210 is within the scope of the invention.

In an embodiment, printed circuit board 200 can be coupled for receiving packaged chip 212. Packaged chip 212 can be, for example, an integrated circuit, processor chip, memory chip, storage chip, and the like that is designed to be coupled to printed circuit board 200. In an embodiment, packaged chip 212 can include a plurality of package terminals 216, where at least two of the package terminals 216 are coupled to interface with first BGA landing pad 202 and second BGA landing pad 204 respectively. In an embodiment, the at least two package terminals 216 can each be a package ball coupled to interface with first BGA landing pad 202 and second BGA landing pad 204 respectively.

For example, each package ball 216 can be a solder ball coupled to interface with a BGA landing pad. Once interfaced with BGA landing pad, heat can be applied to at least partially liquefy the package ball. Thereby the package ball couples to BGA landing pad as is known in the art.

In an embodiment, via 210 can electrically couple each of the two of the plurality of package terminals 216 to each other through each of the first BGA landing pad 202 and second BGA landing pad 204 respectively. This can have the effect of placing the two of the plurality of package terminals 216 at the same voltage level with each other. The same voltage level can be above ground as in a power supply to packaged chip or as a common ground to packaged chip.

While we have shown and described specific embodiments of the present invention, further modifications and improvements will occur to those skilled in the art. It is therefore, to be understood that appended claims are intended to cover all such modifications and changes as fall within the true spirit and scope of the invention.

The invention claimed is:

1. A printed circuit board, comprising:
a first BGA landing pad having a first clearance zone;
a second BGA landing pad having a second clearance zone;
a via, wherein the via overlaps the first clearance zone and the second clearance zone such that the first BGA landing pad and the second BGA landing pad are electrically coupled to the via; and
a packaged chip, wherein the printed circuit board is coupled for receiving the packaged chip, wherein the packaged chip comprises a plurality of package terminals, and wherein at least two of the package terminals are coupled to interface with the first BGA landing pad and the second BGA landing pad respectively.

2. The printed circuit board of claim 1, wherein the at least two of the package terminals are each a package ball coupled to interface with the first BGA landing pad and the second BGA landing pad respectively.

3. The system, comprising:
a printed circuit board having a surface;
a first BGA landing pad having a first clearance zone;
a second BGA landing pad having a second clearance zone, wherein the first BGA landing pad and the second BGA landing pad are disposed on the surface of the printed circuit board;
a via, wherein the via overlaps the first clearance zone and the second clearance zone such that the first BGA landing pad and the second BGA landing pad are electrically coupled to the via; and
a packaged chip, wherein the printed circuit board is coupled for receiving the packaged chip, wherein the packaged chip comprises a plurality of package terminals, and wherein at least two of the package terminals are coupled to interface with the first BGA landing pad and the second BGA landing pad respectively.

4. The system of claim 3, wherein the at least two of the package terminals are each a package ball coupled to interface with the first BGA landing pad and the second BGA landing pad respectively.

5. A method, comprising:
providing a printed circuit board having a surface;
disposing a first BGA landing pad having a first clearance zone on the surface;
disposing a second BGA landing pad having a second clearance zone on the surface;
disposing a via, wherein the via overlaps the first clearance zone and the second clearance zone such that the first BGA landing pad and the second BGA landing pad are electrically coupled to the via; and
providing a packaged chip, wherein the printed circuit board is coupled for receiving the packaged chip, wherein the packaged chip comprises a plurality of package terminals, and wherein at least two of the package terminals are coupled to interface with the first BGA landing pad and the second BGA landing pad respectively.

6. The method of claim 5, wherein the at least two of the package terminals are each a package ball coupled to interface with the first BGA landing pad and the second BGA landing pad respectively.

* * * * *